(12) United States Patent
Sakimura et al.

(10) Patent No.: US 7,773,405 B2
(45) Date of Patent: Aug. 10, 2010

(54) MAGNETIC RANDOM ACCESS MEMORY AND OPERATING METHOD OF MAGNETIC RANDOM ACCESS MEMORY

(75) Inventors: Noboru Sakimura, Minato-ku (JP); Takeshi Honda, Minato-ku (JP); Tadahiko Sugibayashi, Minato-ku (JP)

(73) Assignee: NEC Corporation, Tokyo (JP)

( * ) Notice: Subject to any disclaimer, the term of this patent is extended or adjusted under 35 U.S.C. 154(b) by 60 days.

(21) Appl. No.: 12/308,062

(22) PCT Filed: Jun. 1, 2007

(86) PCT No.: PCT/JP2007/061185

§ 371 (c)(1),
(2), (4) Date: Dec. 5, 2008

(87) PCT Pub. No.: WO2007/142137

PCT Pub. Date: Dec. 13, 2007

(65) Prior Publication Data

US 2009/0262571 A1   Oct. 22, 2009

(30) Foreign Application Priority Data

Jun. 8, 2006  (JP) .............................. 2006-159312

(51) Int. Cl.
*G11C 11/00* (2006.01)
(52) U.S. Cl. ...................... 365/130; 365/157; 365/158; 365/171; 365/230.07
(58) Field of Classification Search .................. 365/130, 365/157, 158, 171, 230.07
See application file for complete search history.

(56) References Cited

U.S. PATENT DOCUMENTS

2003/0123199 A1 *  7/2003  Honda et al. ................ 360/324

FOREIGN PATENT DOCUMENTS

| JP | 2001-307482 A | 11/2001 |
| JP | 2002-093146 A | 3/2002 |
| JP | 2002-204271 A | 7/2002 |
| JP | 2004-518288 A | 6/2004 |
| JP | 2004-227754 A | 8/2004 |
| JP | 2004-348934 A | 12/2004 |
| JP | 2007-042192 A | 2/2007 |
| JP | 2007-080344 A | 3/2007 |

* cited by examiner

*Primary Examiner*—Hoai V Ho
*Assistant Examiner*—Jason Lappas
(74) *Attorney, Agent, or Firm*—Sughrue Mion, PLLC

(57) ABSTRACT

A magnetic random access memory includes: a first and second wirings, a plurality of third wirings, a plurality of memory cells and a terminating unit. The first and second wirings extend in a Y direction. The plurality of third wirings extends in an X direction. The memory cell is provided correspondingly to an intersection between the first and second wirings and the third wiring. The terminating unit is provided between the plurality of memory cells and connected to the first and second wirings. The memory cell includes transistors and a magnetoresistive element. The transistors are connected in series between the first and second wirings and controlled based on a signal of the third wiring. The magnetoresistive element is connected to a wiring through which the transistors are connected. At a time of a writing operation, when the write current Iw is supplied from one of the first and second wiring to the other through the transistors, the terminating unit grounds the other.

11 Claims, 11 Drawing Sheets

MAGNETIC RANDOM ACCESS MEMORY AND OPERATING METHOD OF MAGNETIC RANDOM ACCESS MEMORY

TECHNICAL FIELD

The present invention relates to a magnetic random access memory (MRAM: Magnetic Random Access Memory) in which a magnetoresistive element (MTJ: Magnetic Tunnel Junction) is used in a memory cell as a storage element.

BACKGROUND ART

This application is based upon and claims the benefit of priority from Japanese patent application No. 2006-159312 filed on Jun. 8, 2006, the disclosure of which is incorporated herein in its entirety by reference.

The MTJ element used in the memory cell of the MRAM includes: a pinned magnetic layer whose magnetization is pinned in any direction; and a free magnetic layer whose magnetization can be varied by an external magnetic field. The pinned magnetic layer and the free magnetic layer are laminated such that a tunnel insulating film is sandwiched between them. In the MRAM, one-bit storage information is assigned to the relative magnetization state between the pinned magnetic layer and the free magnetic layer. For example, when the magnetizations of the pinned magnetic layer and the free magnetic layer are equal in direction, namely, in a parallel state, this case is defined as “0”. If the magnetizations of the pinned magnetic layer and the free magnetic layer are different from each other by 180 degrees, namely, in an anti-parallel state, this case is defined as “1”. Then, the reading from the MRAM is executed by using the fact that the MTJ resistance is different based on the magnetization state.

The writing principle of the typical MRAM will be described below. Write currents are supplied into a write word line extending in parallel to the magnetization easy axis of the magnetic layer and a write bit line extending vertically thereto, respectively. The magnetization of the free magnetic layer is switched in a desirable direction by the synthesis magnetic field generated by the respective write currents. In this way, the memory cell is selected and a writing operation is executed on the memory cell based on the magnetization switching property of the MTJ element. At this time, a lower limit and an upper limit exist in the write current value, and a writable margin is narrow. Thus, in order to selectively carry out the writ operation, a current value and a current waveform are required to be accurately controlled. Hence, a current source circuit becomes complex, which makes the high speed writing operation difficult.

The memory cell (2-Transistor-1-MTJ memory cell: 2T1MTJ cell) in which the write current is electrically selected by a transistor and a diode is disclosed in Japanese Laid-Open Patent Application JP-P2004-348934A (corresponding to U.S. Pat. No. 7,184,301(B2)). FIG. 1 is a view showing a part of a configuration of MRAM disclosed in Japanese Laid-Open Patent Application JP-P2004-348934A. The MRAM includes a memory array 101, a decoder 108 and a write circuit 109. Incidentally, on drawings in this Description, the MTJ element is indicated by the symbol of a variable resistor.

The memory array 101 includes: a plurality of word lines (WL) 103 extending in an X-direction; a plurality of first bit lines (/WBL) 104 extending in a Y-direction; a plurality of second bit lines (WBL) 105, a plurality of third bit lines (RBL) 110; and a plurality of memory cells 102 arranged in a matrix shape. In each of the plurality of word lines 103, one end is connected to a decoder 108. One first bit line 104, one second bit line 105 and one third bit line 110 provide one set of bit lines. The first bit line 104 and the second bit line 105 are complementary, and their one ends are connected to a write circuit 109. The third bit line 110 is connected to, for example, a reading circuit (not shown). Each of the plurality of memory cells 102 is arranged correspondingly to each of the intersections between the plurality of word lines 103 and the plurality of bit line sets.

The memory cell 102 includes a first transistor 106, a second transistor 116 and an MTJ element 107. In the first transistor 106, its gate is connected to the word line 103, and one terminal is connected to the first bit line 104, respectively. In the second transistor 116, its gate is connected to the word line 103, one terminal is connected to the other terminal of the first transistor 106, and the other terminal is connected to the second bit line 105, respectively. That is, the first transistor 106 and the second transistor 116 are connected in series between the first bit line 104 and the second bit line 105. In the MTJ element 107, one terminal is connected to the connection point between the first transistor 106 and the second transistor 116, and the other terminal is connected to the third bit line, respectively.

The decoder 108 selects the selection word line 103 from the plurality of word lines 103, at the times of the writing operation and the reading operation. The write circuit 109 supplies a write current $I_W$ in the direction corresponding to a write data, to the route of the first bit line 104, the selection cell 102 and the second bit line 105 in the selection bit line sets selected from the plurality of bit line sets based on an address signal, at the time of the writing operation. Here, the selection cell 102 is the memory cell 102 selected in the selection word line 103 and the selection bit line set from the plurality of memory cells 102.

In this invention, the circuit is devised such that the write current $I_W$ flows through only the selection memory cell 102. For example, the writing operation is carried out by the write current $I_W$ flowing from the second bit line 105 to the first bit line 104 in which both are complementary, at the time that the word line 103 is activated. This method has a merit that the selection property of the memory cell 102 at the time of the writing operation is dramatically improved. Thus, the current value and current waveform of the write current $I_W$ are not required to be accurately controlled, which can simplify the circuit, and it becomes easy to carry out the writing operation at a high speed.

In this way, in the 2T1MTJ, when the current value of the write current $I_W$ is greater than a magnetization switching threshold, the writing operation is stably executed. However, as the bit capacity of the memory array 101 is increased, a parasitic resistance 120 of the first bit line 104 and the second bit line 105 is increased. Thus, it is difficult to supply the write current $I_W$ having a sufficient value to the memory cell 102 located far away from the writing circuit 109. This is mainly caused by the following reasons.

In the writing operation, preferably, the write current $I_W$ that is as large as possible is supplied into the memory cell 102. The value of the write current $I_W$ is mainly limited by the on-resistances of the first transistor 106 and the second transistor 116 in the memory cell 102. Moreover, when the memory array 101 is large, it is also limited by the parasitic resistances 120 in the respective bit lines. At this time, the value of the write current $I_W$ is greatly limited by the parasitic resistance 120 on a termination side, as compared with the parasitic resistance 120 on a source side of the write current $I_W$. For example, as shown in FIG. 1, when the write current $I_W$ is supplied from the second bit line 105 to the first bit line 104, as compared with the parasitic resistance 120 of the second bit line 105, the parasitic resistance 120 of the first bit line 104 greatly attenuates the value of the write current $I_W$. This is because, since the source electrode voltage of the first transistor 106 is increased, the on-resistance of the first transistor 106 is increased, and the on-resistance of the second transistor 116 is also increased. Similarly, when the write current $I_W$ is supplied from the first bit line 104 to the second bit line 105, the parasitic resistance 120 of the second bit line 105 greatly decreases the value of the write current $I_W$. That is, the on-resistances of the first transistor 106 and the second transistor 116 in the memory cell 102 are increased by the parasitic resistance 120 of the bit line on the side at which the write current $I_W$ terminates. This becomes the main reason that leads to the drop in the write current $I_W$.

In order to avoid such a phenomenon, it is considered that the wiring widths of the first bit line 104 and the second bit line 105 are made thick, thereby decreasing the parasitic resistance 120, or the gate widths of the first transistor 106 and second transistor 116 in the memory cell 102 are made thick. However, all of those countermeasures result in the increase in the areas of the memory cell 102 and the memory array 101. Thus, the bit capacity of the memory array 101 cannot be efficiently increased. A technique is desired which can stably supply the sufficient write current $I_W$ to the memory cell without increasing the area of the memory array 101.

As the related art, Japanese Laid-Open Patent Application JP-P2001-307482A discloses a semiconductor storage device. This semiconductor storage device inputs and outputs a data through an input/output circuit coupled to an inner data line. This semiconductor storage device includes a DRAM array, a SRAM array, a data transferring means, a sense amplifier means and a control means. The DRAM array is composed of a plurality of dynamic memory cells arrayed in a matrix shape. The SRAM array is composed of a plurality of static memory cells arrayed in a matrix shape. The data transferring means is provided at a position different from the inner data line and transfers the data between the DRAM array and the SRAM array. The sense amplifier means detects, amplifies and latches the information of the memory cell selected in the DRAM array. The control means responds to the transferring instruction to the SRAM array from the DRAM array and activates the transferring means at a timing earlier than an activation timing of the sense amplifier means. The column line of the DRAM array is directly coupled to the data transferring means.

Japanese Laid-Open Patent Application JP-P2002-204271A discloses a termination circuit of a common bus and a common bus system. The termination circuit of this common bus is connected to a plurality of input/output units. The termination circuit of the common bus includes a signal input/output means, a waveform shaper means, a gate means, a connector means, a delaying means and an applying means. The signal input/output means captures the signal sent through the common bus and outputs the signal to the common bus. The waveform shaper means shapes the waveform of the signal on the common bus captured through this signal input/output means. The gate means captures the output signal from this waveform shaper means, and controls whether this signal is stopped or outputted from an own output end in accordance with a control signal. The connector means connects the output end of this gate means to an input end linked to the output end of the signal input/output unit connected to the common bus. The delaying means captures and delays the output of the waveform shaper means. The applying means applies the output of an exclusive OR between this delaying means output and the waveform shaper means output as the control signal of the gate means.

Japanese Laid-Open Patent Application JP-P2004-227754A (corresponding to U.S. Pat. No. 6,839,270(B2)) discloses a system for and a method of accessing a 4-conductor magnetic random access memory. This control circuit is intended to perform the writing/reading operation from/to a magnetic random access memory (MRAM) cell. This control circuit includes: a row decoder (608), a first reading/writing row driver (609), a plurality of global row write conductors, a plurality of row taps, and a second reading/writing row driver (610). The first reading/writing row driver (609) is connected to the row decoder (608). The plurality of global row write conductors is connected to the first reading/writing row driver (609). The plurality of row taps is connected to the plurality of global row write conductors, respectively. The second reading/writing row driver (610) is connected to the global row write conductor.

DISCLOSURE OF INVENTION

An object of the present invention is to provide a MRAM and a method of operating the MRAM in which a sufficient write current can be stably supplied to a memory cell without any increase in areas of the memory cell and a memory array in the MRAM using the 2T1MTJ cells.

Also, another object of the present invention is to provide a MRAM and a method of operating the MRAM in which a sufficient write current can be stably supplied to a memory cell without any increase in areas of the memory cell and a memory array, and a memory capacity can be efficiently increased, in the MRAM using the 2T1MTJ cells.

A magnetic random access memory of the present invention includes: a first wiring, a second wiring, a plurality of third wirings, a plurality of memory cells and at least one terminating unit. The first wiring and the second wiring extend in a first direction. The plurality of third wirings extends in a second direction. The plurality of memory cells is provided correspondingly to respective intersections between the first and second wirings and the plurality of third wirings. At least one terminating unit is provided between the plurality of memory cells and connected to the first wiring and the second wiring. Each of the plurality of memory cells includes two transistors and a magnetoresistive element. The two transistors are connected in series between the first wiring and the second wiring and controlled based on a signal of the third wiring. The magnetoresistive element is connected to a wiring through which the two transistors are connected. At a time of a writing operation of each of the plurality of memory cells, when the write current is supplied from one of the first wiring and the second wiring to the other through the two transistors, the at least one terminating unit grounds the other.

The present invention is an operating method of a magnetic random access memory. Here, the magnetic random access memory includes a first wiring, a second wiring, a plurality of third wirings, a plurality of memory cells, at least one terminating unit and a writing unit. The first wiring and the second wiring extend in a first direction. The plurality of third wirings extends in a second direction. The plurality of memory cells is provided correspondingly to respective intersections between the first and second wirings and the plurality of third wirings. At least one terminating unit is provided between the plurality of memory cells and connected to the first wiring and the second wiring. The writing unit is connected to ends of the first wiring and the second wiring. Each of the plurality of memory cells includes two transistors and a magnetoresistive element. The two transistors are connected in series between the first wiring and the second wiring and controlled based on a signal of the third wiring. The magnetoresistive element is connected to a wiring through which the two transistors are connected. The operating method of the magnetic random access memory, at a time of a writing operation of each of the plurality of memory cells, includes: (A) the writing unit setting one of the first wiring and the second wiring to a relatively high potential state and setting the other to a relatively low potential state based on a write data; and (B) when a write current is supplied from one to the other through the two transistors, the at least one terminating unit grounds the other.

BEST MODE FOR CARRYING OUT THE INVENTION

The MRAM according to exemplary embodiments of the present invention will be described below with reference to the attached drawings.

First Exemplary Embodiment

Figure 1:
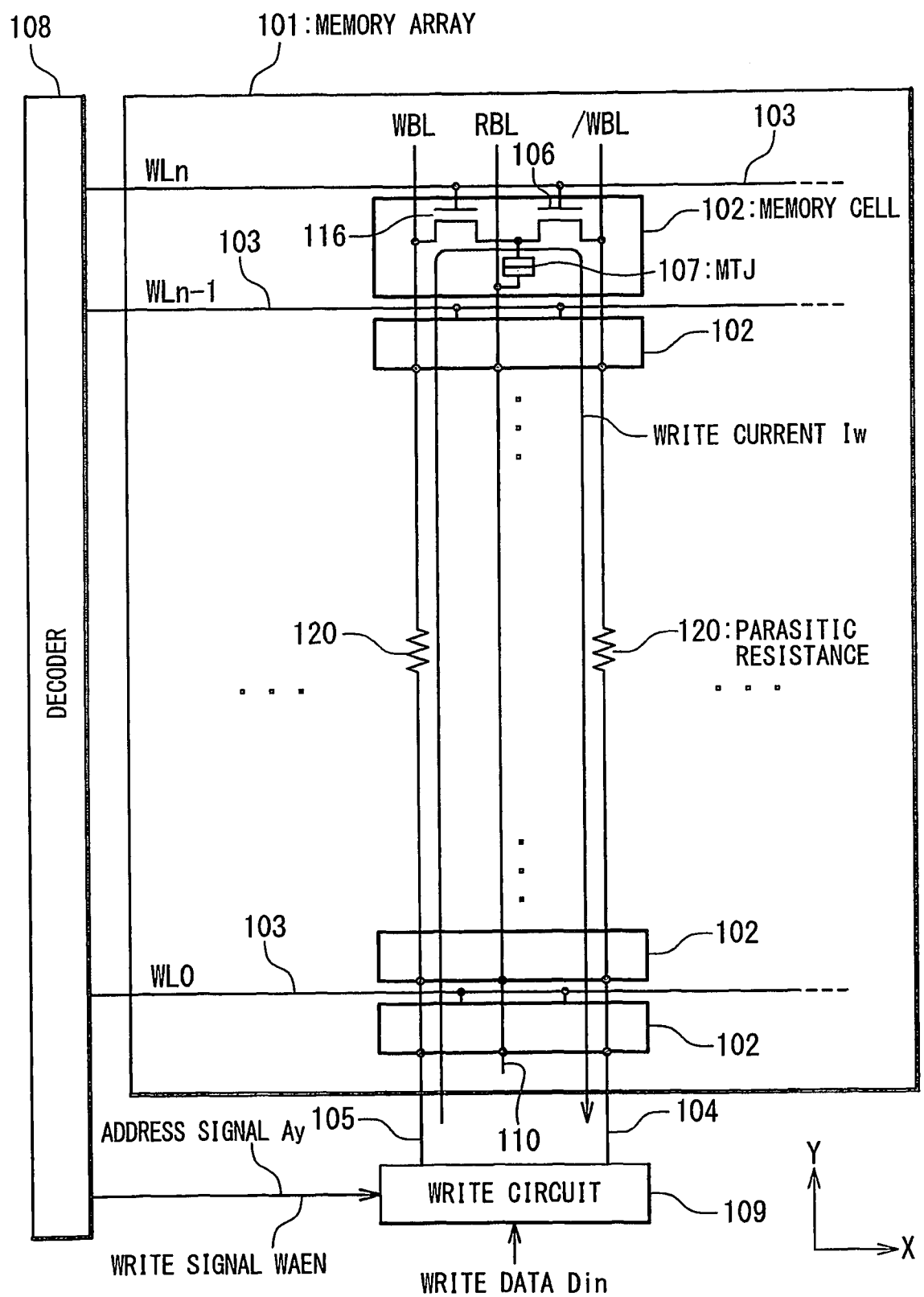
FIG. 1 is a view showing a part of a configuration of a MRAM disclosed in Japanese Laid-Open Patent Application JP-P2004-348934A.
Figure 2:
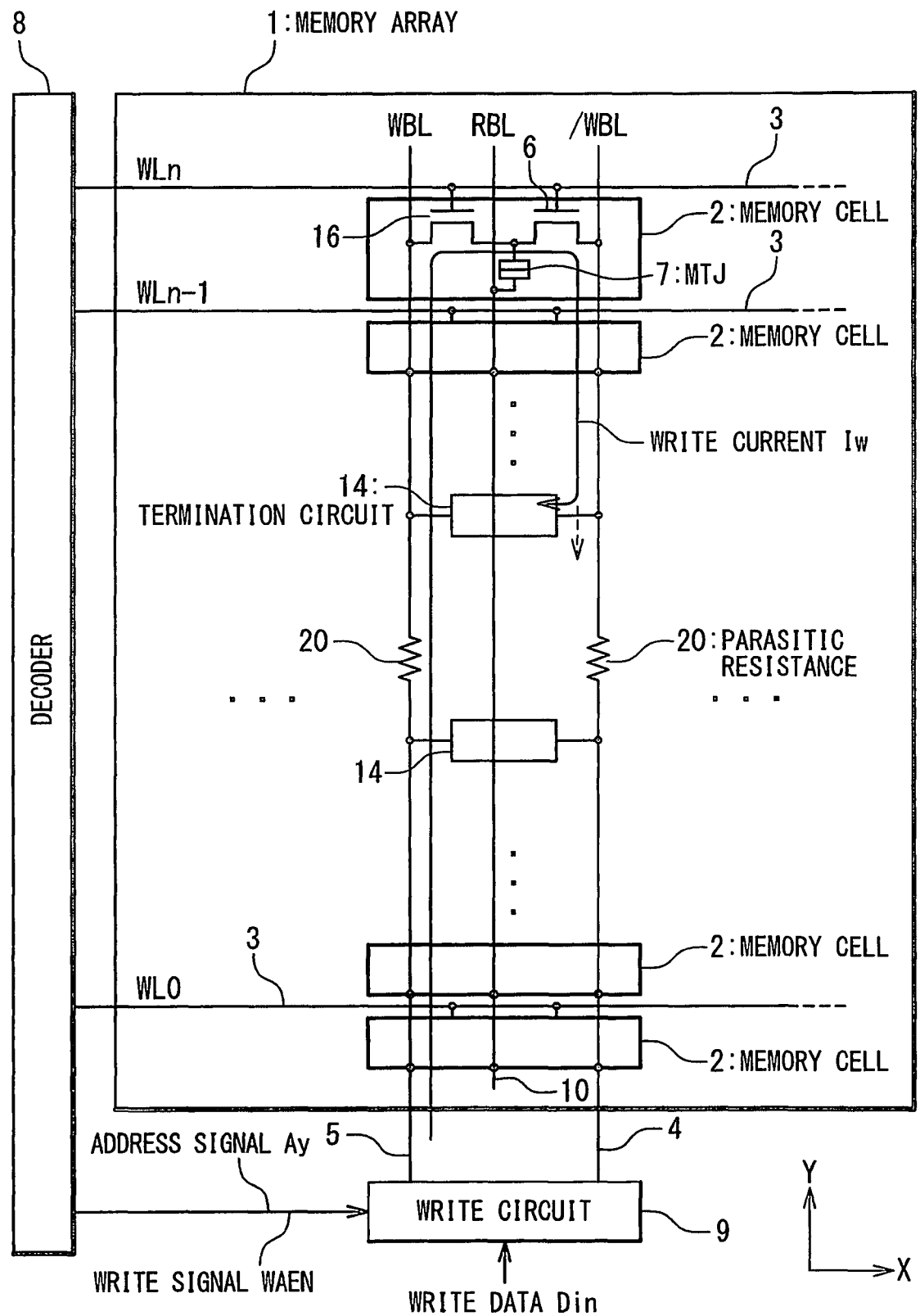
FIG. 2 is a block diagram showing a configuration of the MRAM according to a first exemplary embodiment of the present invention.

The MRAM in the first exemplary embodiment of the present invention will be described below with reference to the attached drawings. FIG. 2 is a block diagram showing a configuration of the MRAM according to the first exemplary embodiment of the present invention. The MRAM includes a memory array 1, a decoder 8 and a plurality of writing circuits 9.

The memory array 1 includes a plurality of word lines 3, a plurality of first bit lines 4, a plurality of second bit lines 5, a plurality of third bit lines 10, a plurality of memory cells 2, and a plurality of termination circuits 14. The plurality of wordlines 3 extends in an x-direction, and their one ends are connected to the decoder 8. The plurality of first bit lines 4 and the plurality of second bit lines 5 extend in a Y-direction, and their one ends are connected to the writing circuits 9. The first bit line 4 and the second bit line 5 are complementary. The plurality of third bit lines 10 extends in the Y-direction, and they are connected to, for example, a reading circuit (not shown). One first bit line 4 and one second bit line 5 and one third bit line 10 provide one set of bit line sets. Each of the plurality of memory cells 2 is provided correspondingly to each of intersections between the plurality of word lines 3 and the plurality of bit line sets.

The memory cell 2 includes a first transistor 6, a second transistor 16 and an MTJ element 7 (2T1MTJ). In the first transistor 6, its gate is connected to the word line 3, and one terminal is connected to the first bit line 4, respectively. In the second transistor 16, its gate is connected to the word line 3, one terminal is connected to the other terminal of the first transistor 6, and the other terminal is connected to the second bit line 5, respectively. That is, the first transistor 6 and the second transistor 16 are connected in series between the first bit line 4 and the second bit line 5. Since a current flows through a write wiring as the wiring through which the first transistor 6 and the second transistor 16 are connected, data is written to the MTJ element 7 arranged in the vicinity thereof. In the MTJ element 7, one terminal is connected to the write wiring between the first transistor 6 and the second transistor 16, and the other terminal is connected to the third bit line, respectively.

The decoder 8 selects the selection word line 3 from the plurality of word lines 3, at the times of the writing operation and the reading operation.

At the time of the writing operation, the decoder 8 outputs an address signal Ay and a write signal WAEN to the plurality of writing circuits 9. The address signal Ay corresponding to the address inputted to the decoder 8 is activated, thereby the writing circuit 9 corresponding to the address signal Ay is activated. At this time, the memory cell at the intersection between the selection word line 3 and the selection first and second bit lines 4 and 5 connected to the active writing circuit 9 is selected.

At the time of the reading operation, the third bit line 10 corresponding to the input address is selected based on the address signal Ay and a reading signal (not shown). Specifically, the selected third bit line 10 and the reading circuit (not shown) become in the electrically connection state. At this time, the memory cell at the intersection between the selection word line 3 and the selection third bit line 10 is selected.

The writing circuit 9 is provided for each of the plurality of bit line sets. At the time of the writing operation, in the selection bit line set selected from the plurality of bit line sets based on the address signal Ay, based on the write data, a power source voltage (Vdd) is applied to one of the first bit line 4 and the second bit line 5, and a ground voltage (Gnd) is applied to the other. Consequently, a write current $I_W$ is supplied in the direction corresponding to the write data to, the route of the first bit line 4, the selection cell 2, the second bit line 5. Here, the selection cell 2 is the memory cell 2 selected by the selection word line 3 and the selection bit line set from the plurality of memory cells 2. As for the writing circuits 9, common one may be shared by the plurality of bit line sets.

The termination circuits 14 are dispersedly provided inside the memory array 1. In detail, at least one termination circuit 14 is provided inside each of the plurality of bit line sets. One terminal is connected to the first bit line 4, and the other terminal is connected to the second bit line 5, respectively. The termination circuit 14 terminates the write current $I_W$ flowing through the selection cell 2 to a ground line (not shown). For example, in the example shown in FIG. 2, the termination circuit 14 receives the write current $I_W$ flowing through the writing circuit 9, the second bit line 5, the selection cell 2, and the first bit line 4 at the terminal on the side of the first bit line 4 and guided to the ground line. When the direction of the write current $I_W$ is reversed, the termination circuit 14 receives the write current $I_W$ flowing through the writing circuit 9, the first bit line 4, the selection cell 2, and the second bit line 5 at the terminal on the side of the second bit line 5 and guided to the ground line.

Since the foregoing termination circuits 14 are provided, the write current $I_W$ after passing through the selection cell 2 mainly flows into the closest termination circuit 14 without flowing to the writing circuit 9 (although the partial write current $I_W$ flows into even the different termination circuit 14, most of the write current $I_W$ flows into the termination circuit 14 that is located closest). Thus, it is possible to substantially reduce a parasitic resistance 20 of the bit line on the termination side (the first bit line 4 in the case of FIG. 2).

The termination circuits 14 are dispersedly provided inside the bit line set, when the plurality of termination circuits 14 are provided inside one bit line set. For example, they are arranged at an equal interval. Then, they are preferably provided at the positions where the influences of the parasitic resistance 20 are similarly reduced for the writings to the respective memory cells 2.

Also, preferably, as the number of the termination circuits 14 is greater, the influence of the parasitic resistance 20 can be suppressed. However, on the other hand, as the number becomes greater, the area of the memory array 1 becomes wider. Thus, it is considered that the number exists under which the arrangement efficiency of the termination circuits 14 is optimal. Its number is determined by the design based on the configuration of the memory array 1 and the like.

Figure 3:
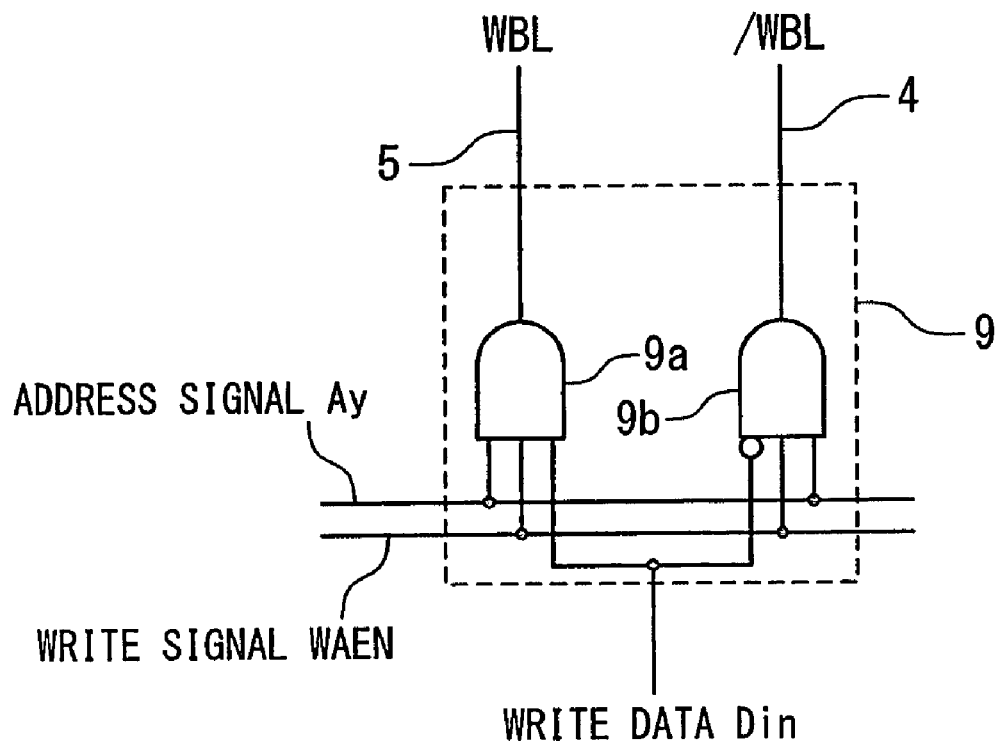
FIG. 3 is a circuit diagram showing an example of a configuration of a writing circuit 9 in the MRAM in FIG. 2.

FIG. 3 is a circuit diagram showing one example of a configuration of the writing circuit 9 in the MRAM in FIG. 2. The writing circuit 9 includes two AND gates 9a, 9b whose inputs are the decoded address signal Ay and the write signal WAEN and the write data Din. Here, the write data Din of the AND gate 9b is inverted and inputted. At the time of the writing operation (the address signal Ay and the write signal WAEN are at High levels), for example, when the write data Din is "0", the ground voltage (Low level) is applied to the second bit line 5, and the power source voltage (High level) is applied to the first bit line 4. Similarly, when the write data Din is "1", the power source voltage is applied to the second bit line 5, and the ground voltage is applied to the first bit line 4. At the time of the reading operation (the write signal WAEN is at the Low level), the second bit line 5 and the first bit line 4 are both grounded and serve as the termination route of a reading current IR.

Figure 4:
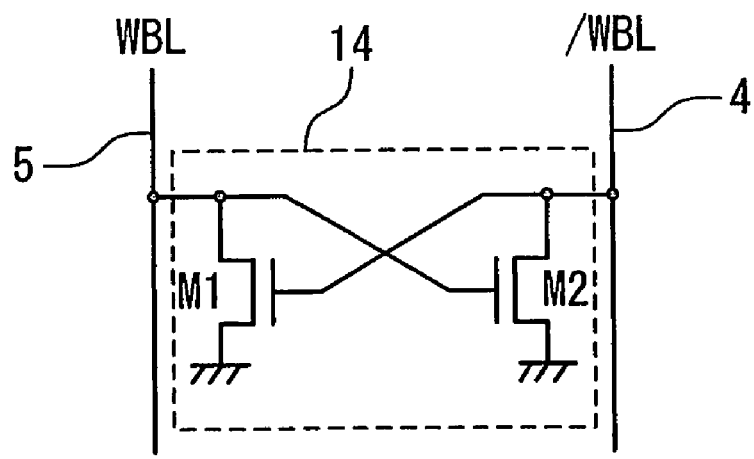
FIG. 4 is a circuit diagram showing an example of a configuration of a termination circuit 14 in the MRAM in FIG. 2.

FIG. 4 is a circuit diagram showing one example of a configuration of the termination circuit 14 in the MRAM in FIG. 2. The termination circuit 14 includes: an N-type transistor M1 for grounding the second bit line 5 and an N-type transistor M2 for grounding the first bit line 4. In the transistor M1, its gate is connected to the first bit line 4, one terminal is connected to the second bit line 5, and the other terminal is connected to the ground line, respectively. In the transistor M2, its gate is connected to the second bit line 5, one terminal is connected to the first bit line 4, and the other terminal is connected to the ground line, respectively. In this way, the configuration of the termination circuit 14 is very simple, which can suppress the increase in the circuit area to a small value.

At the time of the writing operation, for example, when the write data Din is "0", since the first bit line 4 is at the High level, the transistor M1 is on, and since the second bit line 5 is at the Low level, the transistor M2 is off. At this time, the write current $I_W$, after passing from the first bit line 4 through the selection cell 2 and entering the second bit line 5, flows through the transistor M1 in the nearest termination circuit 14 into the ground line. Similarly, when the write data Din is "1", since the first bit line 4 is at the Low level, the transistor M1 is off, and since the second bit line 5 is at the High level, the transistor M2 is on. At this time, the write current $I_W$, after passing from the second bit line 5 through the selection cell 2 and entering the first bit line 4, flows through the transistor M2 in the nearest termination circuit 14 into the ground line. At the time of the reading operation, the voltages of the second bit line 5 and the first bit line 4 are both at the Low level. Thus, both of the transistors M1, M2 are off. That is, a circuit for generating a special control signal is not required, and the supply of the control signal to the termination circuit 14 is not required. Thus, the termination circuit 14 can be extremely easily operated.

Figure 5:
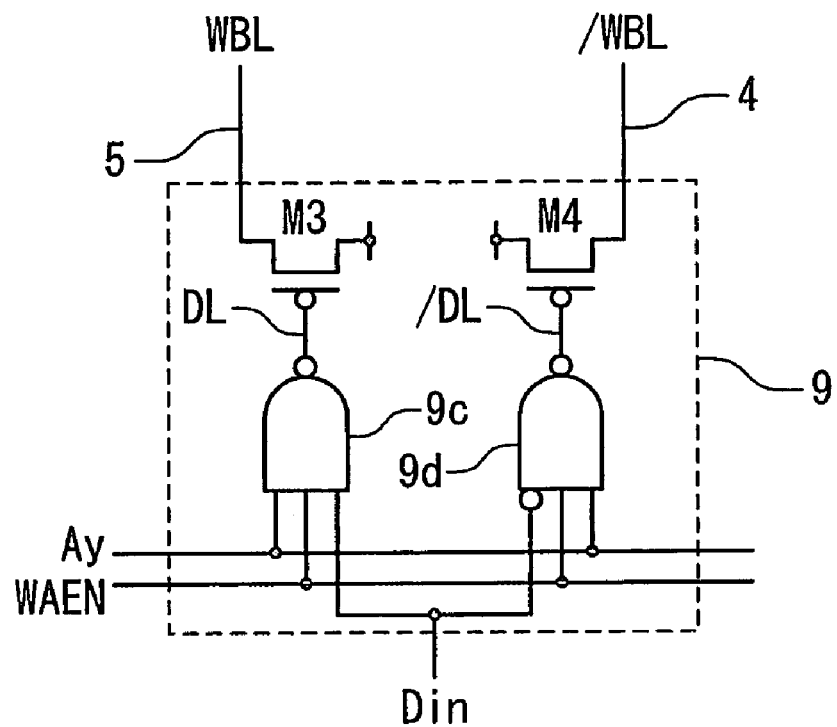
FIG. 5 is a circuit diagram showing another example of a configuration of the writing circuit 9 in the MRAM in FIG. 2.

FIG. 5 is a circuit diagram showing another example of a configuration of the writing circuit 9 in the MRAM in FIG. 2. The writing circuit 9 includes: two NAND gates 9c, 9d whose inputs are the address signal Ay and the write signal WAEN and the write data Din; and P-type transistors M3, M4 for supplying the write current $I_W$. Here, the write data Din of the AND gate 9b is inverted and inputted. In the transistor M3, its gate is connected to the output of the NAND gate 9c, one terminal is connected to the power source wiring, and the other terminal is connected to the second bit line 5, respectively. In the transistor M4, its gate is connected to the output of the NAND gate 9d, one terminal is connected to the power source wiring, and the other terminal is connected to the first bit line 4, respectively.

At the time of the writing operation (the address signal Ay and the write signal WAEN are at the High level), for example, when the write data Din is "0", the transistor M3 is off, and the transistor M4 is on. Thus, the write current $I_W$ flows through the first bit line 4. Similarly, when the write data Din is "1", the transistor M3 is on, and the transistor M4 is off. Hence, the write current $I_W$ flows into the second bit line 5.

Figure 6:
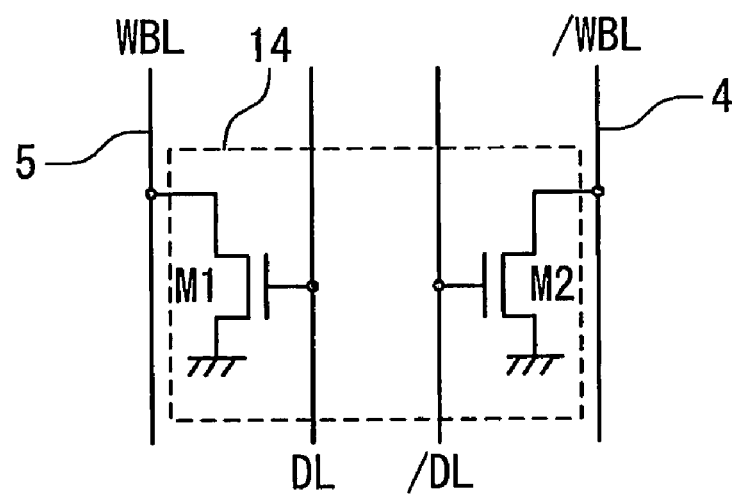
FIG. 6 is a circuit diagram showing another example of a configuration of the termination circuit 14 in the MRAM in FIG. 2.

FIG. 6 is a circuit diagram showing another example of a configuration of the termination circuit 14 in the MRAM in FIG. 2. This termination circuit 14 is used in the case of using the writing circuit 9 shown in FIG. 5. The termination circuit 14 includes: the N-type transistor M1 for grounding the second bit line 5 and the N-type transistor M2 for grounding the first bit line 4. In the transistor M1, its gate is connected to a data line DL for supplying an output signal of the NAND gate 9c, one terminal is connected to the second bit line 5, and the other terminal is connected to the ground line, respectively. In the transistor M2, its gate is connected to a data line /DL for supplying an output signal of the NAND gate 9d, one terminal is connected to the first bit line 4, and the other terminal is connected to the ground line, respectively. In this way, the configuration of the termination circuit 14 is very simple, which can suppress the increase in the circuit area to a small value.

At the time of the writing operation, for example, when the write data Din is "0", the transistor M1 is on, and the transistor M2 is off. At this time, the write current $I_W$, after passing from the first bit line 4 through the selection cell 2 and entering the second bit line 5, flows through the transistor M1 in the nearest termination circuit 14 into the ground line. Similarly, when the write data Din is "1", the transistor M1 is off, and the transistor M2 is on. At this time, the write current $I_W$, after passing from the second bit line 5 through the selection cell 2 and entering the first bit line 4, flows through the transistor M2 in the nearest termination circuit 14 into the ground line. That is, since the output signal of the writing circuit 9 can be also used, the circuit for generating the special control signal is not required, and the termination circuit 14 can be very easily operated.

The writing operation of the MRAM of the present invention is executed as follows. At first, the decoder 8 selects the selection word line 3 from the plurality of word lines 3, based on the control signal (not shown) from the outside. Thus, the first transistor 6 and the second transistor 16 are turned on, in the plurality of memory cells 2 on the selection word line 3. Together with this, the decoder 8 outputs the address signal Ay and the write signal WAEN to the writing circuit 9 selected based on the control signal from the outside. The writing circuit 9 sets one of the first bit line 4 and second bit line 5 in the selection bit line set to the High level and sets the other to the Low level, based on the address signal Ay. The selection cell 2 is selected in the selection word line 3 and the selection bit line set. The writing circuit 9 supplies the write current $I_W$ in the direction corresponding to the write data, to the route of the selected first bit line 4, the selection cell 2, the selected second bit line 5. Thus, in the selection cell 2, the write current $I_W$ flows through the first transistor 6 and the second transistor 16. By the magnetic field generated by the write current $I_W$, the write data is written to the MTJ element 7. At this time, the write current $I_W$, after passing through the memory cell 2, mainly flows into the nearest termination circuit 14. That is, since the write current $I_W$ mainly flows into the termination circuit 14 located closest to the selection cell 2, the write current $I_W$ flows through only a part of the bit line (the first bit line 4 in the case of FIG. 2) on the termination side. Hence, it is possible to substantially reduce the parasitic resistance 20 of the bit line on the termination side.

The reading operation of the MRAM in the present invention is carried out as follows. At first, the decoder 8 selects the selection word line 3 from the plurality of word lines 3, based on the control signal (not shown) from the outside. Thus, the first transistor 6 and the second transistor 16 are turned on, in the plurality of memory cells 2 on the selection word line 3. Together with this, the decoder 8 outputs the address signal Ay and a read signal to the reading circuit (not shown). The reading circuit (not shown) selects the selected third bit line 10 from the plurality of third bit lines 10, based on the address signal Ay. Then, the writing circuit 9 grounds both of the first bit line 4 and the second bit line 5. The selection cell 2 is selected in the selection word line 3 and the selected third bit line 10. In the reading circuit (not shown), the predetermined reading current IR is supplied to the route of the selected third bit line 10, the MTJ element 7 in the selection cell 2, the selected second bit line 5 and the selected first bit line 4. At that time, the data stored in the MTJ element 7 is read in the value of the voltage generated in the selected third bit line 10. That is, it can be read similarly to the conventional technique. At this time, in the case of using the termination circuit 14 shown in FIG. 4, both of the transistors M1, M2 are off. In short, the reading current IR is terminated in the writing circuit 9. When the termination circuit 14 shown in FIG. 6 is used, both of the transistors M1, M2 are on. In short, the reading current IR is terminated in the termination circuit 14 located closest to the selection cell 2.

Figure 7:
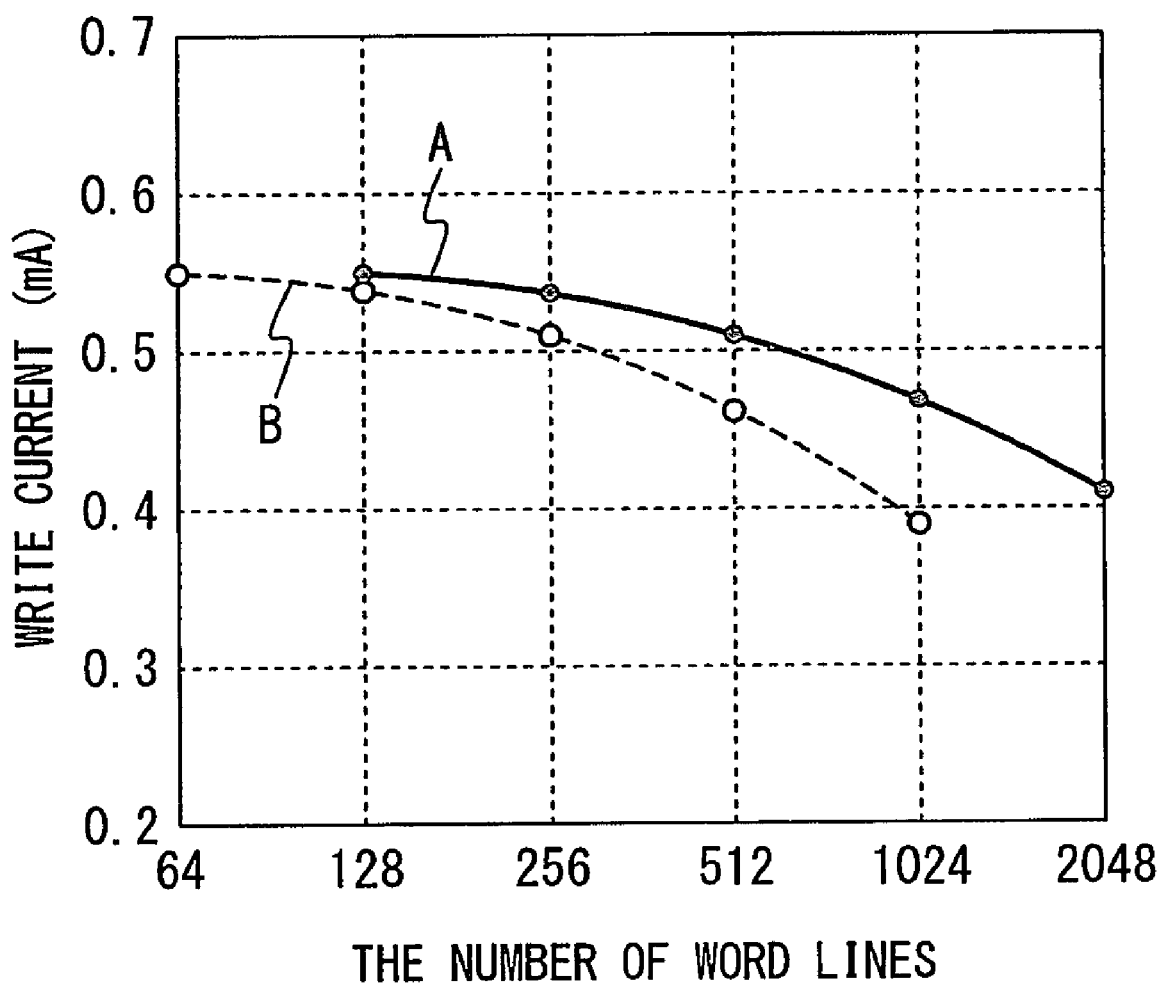
FIG. 7 is a graph showing a circuit simulation result of the MRAM of the present invention.

FIG. 7 is a graph showing a circuit simulation result in the MRAM of the present invention. FIG. 7 is the circuit simulation result in which the foregoing writing circuits 9 and termination circuits 14 are used and the termination circuits 14 are dispersedly arranged at the four positions inside the memory array 1. The horizontal axis indicates the umber of the word lines 3 handled by one writing circuit 9 (the number of the handled memory cells 2). The vertical axis indicates the value of the write current $I_W$ that can be supplied with the same driving force. Also, a curve A indicates the case of the present invention, and a curve B indicates the case of the conventional example, respectively.

When the minimal allowable value of the write current $I_W$ is assumed to be 0.5 mA, the number of the word lines 3 that are allowable in the conventional example (the curve B) is a maximum of about 256. On the other hand, the umber of the word lines 3 that are allowable in the present invention (the curve A) is a maximum of about 512. As a result, in the present invention (the curve A), the number of the word lines can be doubled as compared with the conventional example (the curve B) in which the termination circuit 14 does not exist inside the memory array 1. That is, this graph implies that the bit capacity per memory array 1 can be doubled, while the increase in the areas of the memory cell 2 and the memory array 1 is suppressed to the small value, without any increase in the wiring widths of the bit lines (the first bit line 4 and the second bit line 5) for the writing.

That is, according to the present invention, in the MRAM using the 2T1MTJ cell, the sufficient write current can be stably supplied to the memory cell without any increase in the areas of the memory cell and the memory array. Thus, the memory capacity can be efficiently increased.

Second Exemplary Embodiment

Figure 8:
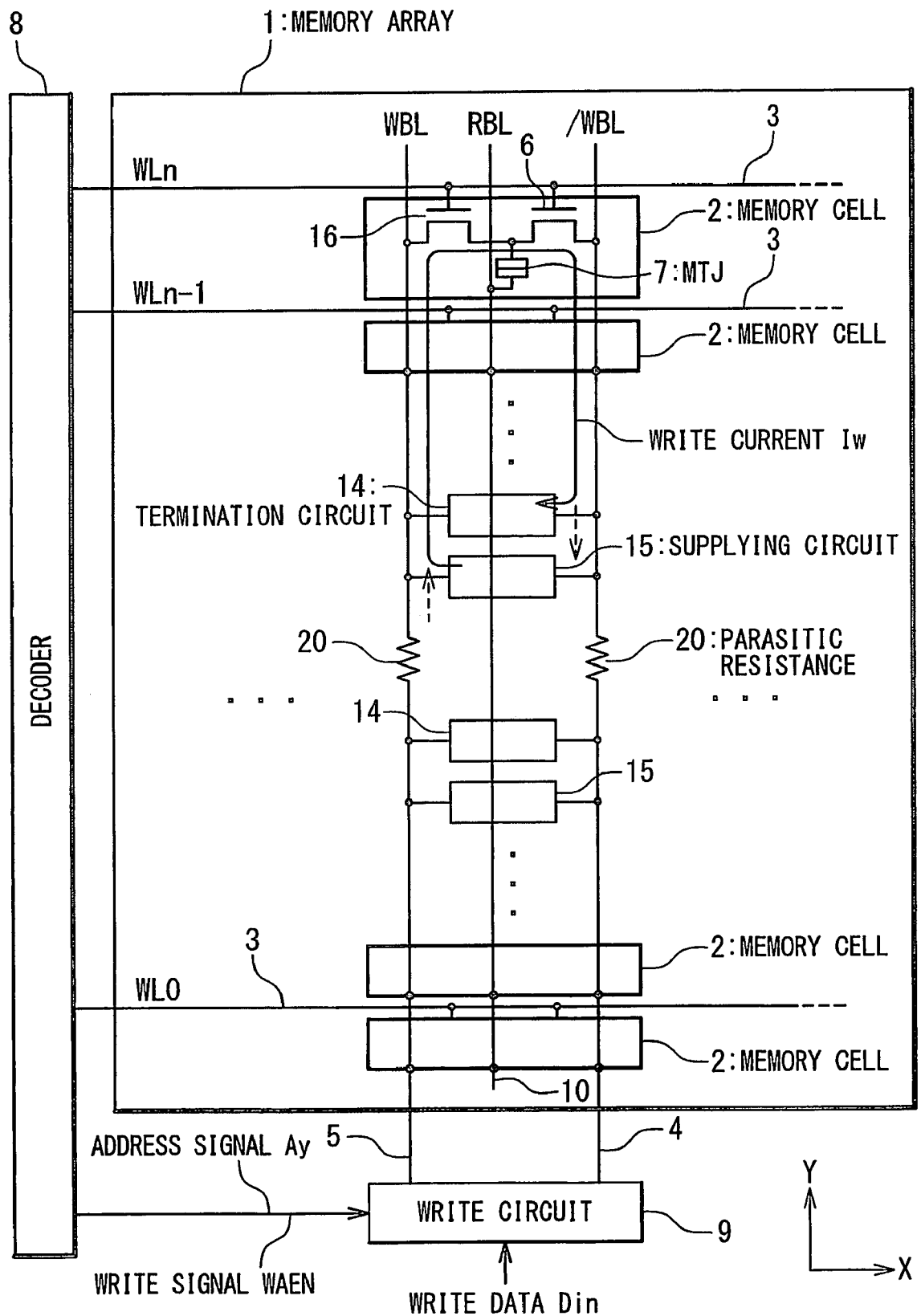
FIG. 8 is a block diagram showing a configuration of the MRAM according to a second exemplary embodiment of the present invention.

The MRAM according to the second exemplary embodiment of the present invention will be described below with reference to the attached drawings. FIG. 8 is a block diagram showing a configuration of the MRAM according to the second exemplary embodiment of the present invention. The MRAM includes the memory array 1, the decoder 8 and the plurality of writing circuits 9.

The MRAM in this exemplary embodiment differs from the MRAM in the first exemplary embodiment in that the memory array 1 includes a plurality of supplying circuits 15 that are dispersedly arranged. Each of the plurality of supplying circuits 15 is, for example, combined with each of the plurality of the termination circuits 14 and arranged to be adjacent thereto. That is, one termination circuit 14 and one supplying circuit 15 are arranged in combination.

The supplying circuit 15 is connected to the first bit line 4 at one terminal, and is connected to the second bit line 5 at the other terminal, respectively. The writing circuit 9 supplies an inversion write signal /WAEN to the supplying circuit 15 after the write signal WAEN is inverted. The supplying circuit 15 supplies the write current $I_W$ to the selection cell 2, based on the inversion write signal /WAEN and the potentials of the first bit line 4 and the second bit line 5. For example, in the example illustrated in FIG. 8, the supplying circuit 15 supplies the write current $I_W$ to the second bit line 5, when the inversion write signal /WAEN is Low, the first bit line 4 is Low and the second bit line 5 is High. The write current $I_W$, after flowing through the selection cell 2 and the first bit line 4, flows into the termination circuit 14. When the direction of the write current $I_W$ is reversed, the supplying circuit 15 supplies the write current $I_W$ to the first bit line 4. The write current $I_W$, after flowing through the selection cell 2 and the second bit line 5, flows into the termination circuit 14.

Since the foregoing supplying circuit 15 is further provided, the write currents $I_W$ are mainly supplied not only from the writing circuit 9 but also from the supplying circuit 15 located closest to the selection cell 2 (although the partial write current $I_W$ is supplied even from the different supplying circuit 15, the largest quantity thereof is supplied from the supplying circuit 15 at the closest location). Then, the write current $I_W$, after passing through the selection cell 2, mainly flows into the termination circuit 14 at the closest location (although the partial write current $I_W$ flows even into the different termination circuit 14, the largest quantity thereof flows into the termination circuit 14 at the closest location). That is, the substantial parasitic resistance 20 of both of the bit line on the supplying side (the second bit line 5 in the case of FIG. 8) and the bit line on the termination side (the first bit line 4 in the case of FIG. 8) can be further reduced as compared with the first exemplary embodiment.

Since the other configurations are similar to those in the first exemplary embodiment, their explanations are omitted.

Figure 9:
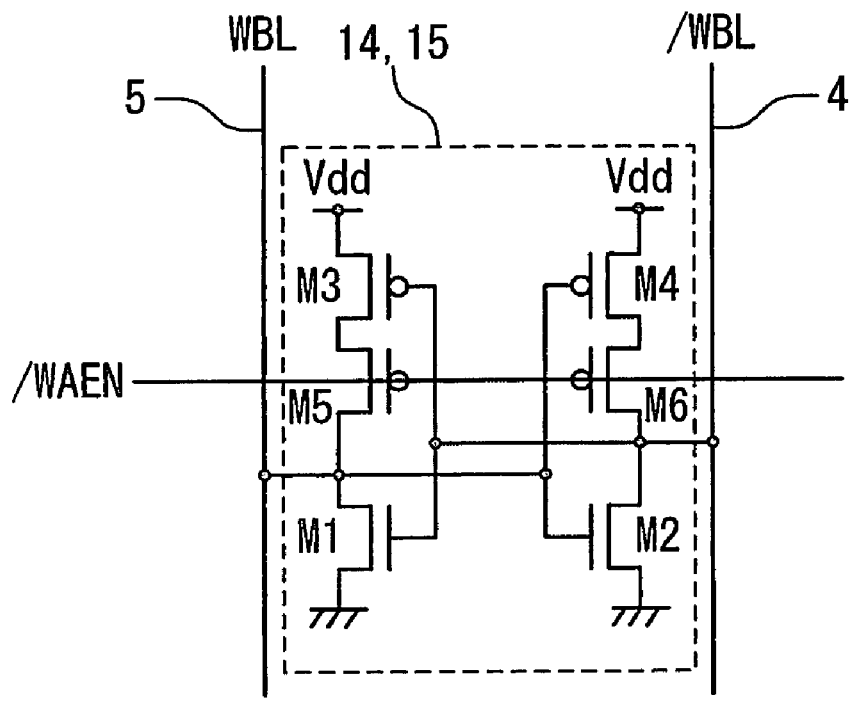
FIG. 9 is a circuit diagram showing an example of configurations of the termination circuit 14 and a supplying circuit 15 in the MRAM in FIG. 8.

FIG. 9 is a circuit diagram showing one example of configurations of the termination circuit 14 and the supplying circuit 15 in the MRAM in FIG. 8. FIG. 9 shows the termination circuit 14 and the supplying circuit 15 when the writing circuit 9 shown in FIG. 3 is used in this exemplary embodiment. In this example, the termination circuit 14 and the supplying circuit 15 are integrated into a single circuit. That is, the integrated termination circuit 14 and supplying circuit 15 include: the N-type transistor M1 for grounding the second bit line 5; the N-type transistor M2 for grounding the first bit line 4; the P-type transistors M3, M5 for supplying the write current $I_W$ to the second bit line 5, and the P-type transistors M4, M6 for supplying the write current $I_W$ to the first bit line 4.

The transistor M1 is connected to the first bit line 4 at its gate, is connected to the second bit line 5 at one terminal, and is connected to the ground line at the other terminal, respectively. The transistor M3 is connected to the first bit line 4 at its gate, is connected to the power source wiring at one terminal, and is connected to one terminal of the transistor M5 at the other terminal, respectively. The transistor M5 is connected to the supply wiring of the inversion write signal /WAEN at its gate, is connected to the other terminal of the transistor M3 at one terminal, and is connected to the second bit line 5 at the other terminal, respectively.

Also, the transistor M2 is connected to the second bit line 5 at its gate, is connected to the first bit line 4 at one terminal, and is connected to the ground line at the other terminal, respectively. The transistor M4 is connected to the second bit line 5 at its gate, is connected to the power source wiring at one terminal, and is connected to one terminal of the transistor M6 at the other terminal, respectively. The transistor M6 is connected to the supply wiring of the inversion write signal /WAEN at its gate, is connected to the other terminal of the transistor M4 at one terminal, and is connected to the first bit line 4 at the other terminal, respectively.

For example, at the time of the writing operation, when the write data Din is "0", since the first bit line 4 is at the High level, the transistor M1 is on, and the transistor M3 is off. Since the second bit line 5 is at the Low level, the transistor M2 is off, and the transistor M4 is on. When the inversion write signal /WAEN is activated to the Low level, the transistors M5, M6 are turned on. At this time, the write current $I_W$ is supplied from the power source wiring (Vdd) through the transistors M4, M6 to the first bit line 4. The write current $I_W$, after passing from the first bit line 4 through the selection cell 2 and entering the second bit line 5, flows through the transistor M1 into the ground line. That is, the integrated termination circuit 14 and supplying circuit 15 is operated as the supplying circuit 15 on the side of the first bit line 4, and operated as the termination circuit 14 on the side of the second bit line 5.

Similarly, when the write data Din is "1", since the first bit line 4 is at the Low level, the transistor M1 is off, and the transistor M3 is on. Since the second bit line 5 is at the High level, the transistor M2 is on, and the transistor M4 is off. When the inversion write signal /WAEN is activated to the Low level, the transistors M5, M6 are turned on. At this time, the write current $I_W$ is supplied from the power source wiring (Vdd) through the transistors M3, M5 to the second bit line 5. The write current $I_W$, after passing from the second bit line 5 through the selection cell 2 and entering the first bit line 4, flows through the transistor M2 into the ground line. That is, the integrated termination circuit 14 and supplying circuit 15 is operated as the supplying circuit 15 on the side of the second bit line 5 and operated as the termination circuit 14 on the side of the first bit line 4.

Incidentally, at the time of the reading operation, the inversion write signal /WAEN becomes in the inactive High level. Thus, in the integrated termination circuit 14 and supplying circuit 15, the transistors M5, M6 are off, and they are not operated as the supplying circuit 15. Also, in the reading operation, for example, since both of the second bit line 5 and the first bit line 4 become at the Low level, both of the transistors M1, M2 are off. Thus, the reading currents IR flowing through the second bit line 5 and the first bit line 4 flow into the ground line without any influence from the integrated termination circuit 14 and supplying circuit 15. Hence, the integrated termination circuit 14 and supplying circuit 15 have no influence on the reading operation.

The writing operation in the MRAM of the present invention is carried out as follows. At first, the decoder 8 selects the selection word line 3 from the plurality of word lines 3, based on the control signal (not shown) from the outside. Thus, in the plurality of memory cells 2 on the selection word line 3, the first transistor 6 and the second transistor 16 are turned on. Together with this, the decoder 8 outputs the address signal Ay and the write signal WAEN to the writing circuit 9 selected based on the control signal from the outside. The writing circuit 9 sets one of the first bit line 4 and the second bit line 5 in the selection bit line set to the High level and sets the other to the Low level, based on the address signal Ay. The selection cell 2 is selected in the selection word line 3 and the selection bit line set. In addition, the writing circuit 9 supplies the inversion write signal /WAEN to the termination circuit 14 and the supplying circuit 15. At this time, the supplying circuit 15 supplies the write current $I_W$ to the route of the selected first bit line 4, the selection cell 2, the selected second bit line 5, and the termination circuit 14, or the route of the selected second bit line 5, the selection cell 2, the selected first bit line 4, and the termination circuit 14, correspondingly to the direction corresponding to the write data. Thus, in the selection cell 2, the write current $I_W$ flows through the first transistor 6 and the second transistor 16. By the magnetic field generated by the write current $I_W$, the write data is written to the MTJ element 107. At this time, since the write current $I_W$ is mainly supplied by the supplying circuit 15 located closest to the selection cell 2, it flows through only a part of the bit line on the supplying side (the second bit line 5 in the case of FIG. 8). Thus, it is possible to substantially reduce the parasitic resistance 20 of the bit line on the supplying side. In addition, the write current $I_W$, after passing through the selection cell 2, mainly flows into the termination circuit 14 at the closest location. Thus, it flows through only a part of the bit line on the termination side (the first bit line 4 in the case of FIG. 8). Hence, it is possible to substantially reduce the parasitic resistance 20 of the bit line on the termination side.

The reading operation in the MRAM of the present invention is similar to that in the first exemplary embodiment. Thus, its explanation is omitted.

Figure 10:
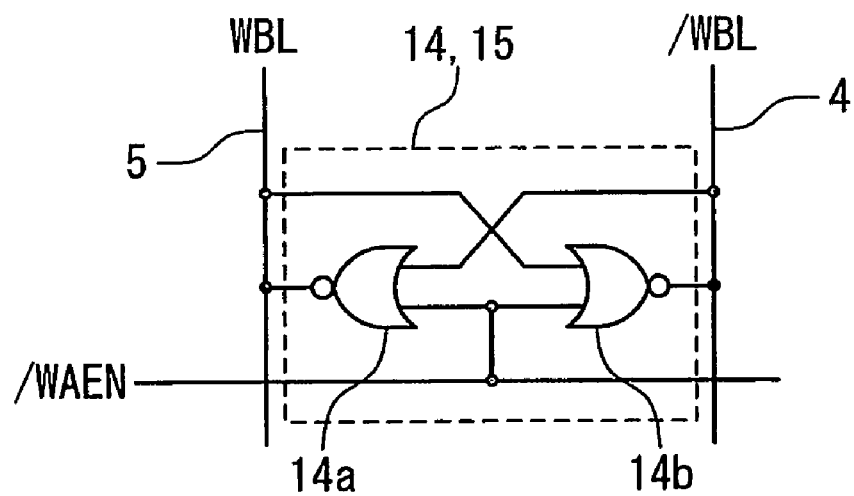
FIG. 10 is a circuit diagram showing another example of configurations of the termination circuit 14 and the supplying circuit 15 in the MRAM.

FIG. 10 is a circuit diagram showing another example of configurations of the termination circuit 14 and the supplying circuit 15 in the MRAM. FIG. 10 shows another termination circuit 14 and supplying circuit 15 when the writing circuit 9 shown in FIG. 3 is used in this exemplary embodiment. In this example, the termination circuit 14 and the supplying circuit 15 are integrated. That is, the integrated termination circuit 14 and supplying circuit 15 include a NOR gate 14a and NOR gate 14b. In the NOR gate 14a, its inputs are connected to the first bit line 4 and the inversion write signal /WAEN, and its output is connected to the second bit line 5. In the NOR gate 14b, its inputs are connected to the second bit line 5 and the inversion write signal /WAEN, and its output is connected to the first bit line 4. Since the operation of the MRAM using this circuit is similar to the case of using FIG. 9, its explanation is omitted.

Also in the case of this exemplary embodiment, it is possible to obtain the effect similar to that in the first exemplary embodiment. In particular, in addition to the parasitic resistance 20 of the bit line on the termination side, the parasitic resistance 20 of the bit line on the supplying side can be reduced, thereby increasing its effect.

That is, according to the present invention, in the MRAM using the 2T1MTJ cell, the sufficient write current can be stably supplied to the memory cell without any increase in the areas of the memory cell and the memory array. Thus, the memory capacity can be efficiently increased.

Third Exemplary Embodiment

Figure 11:
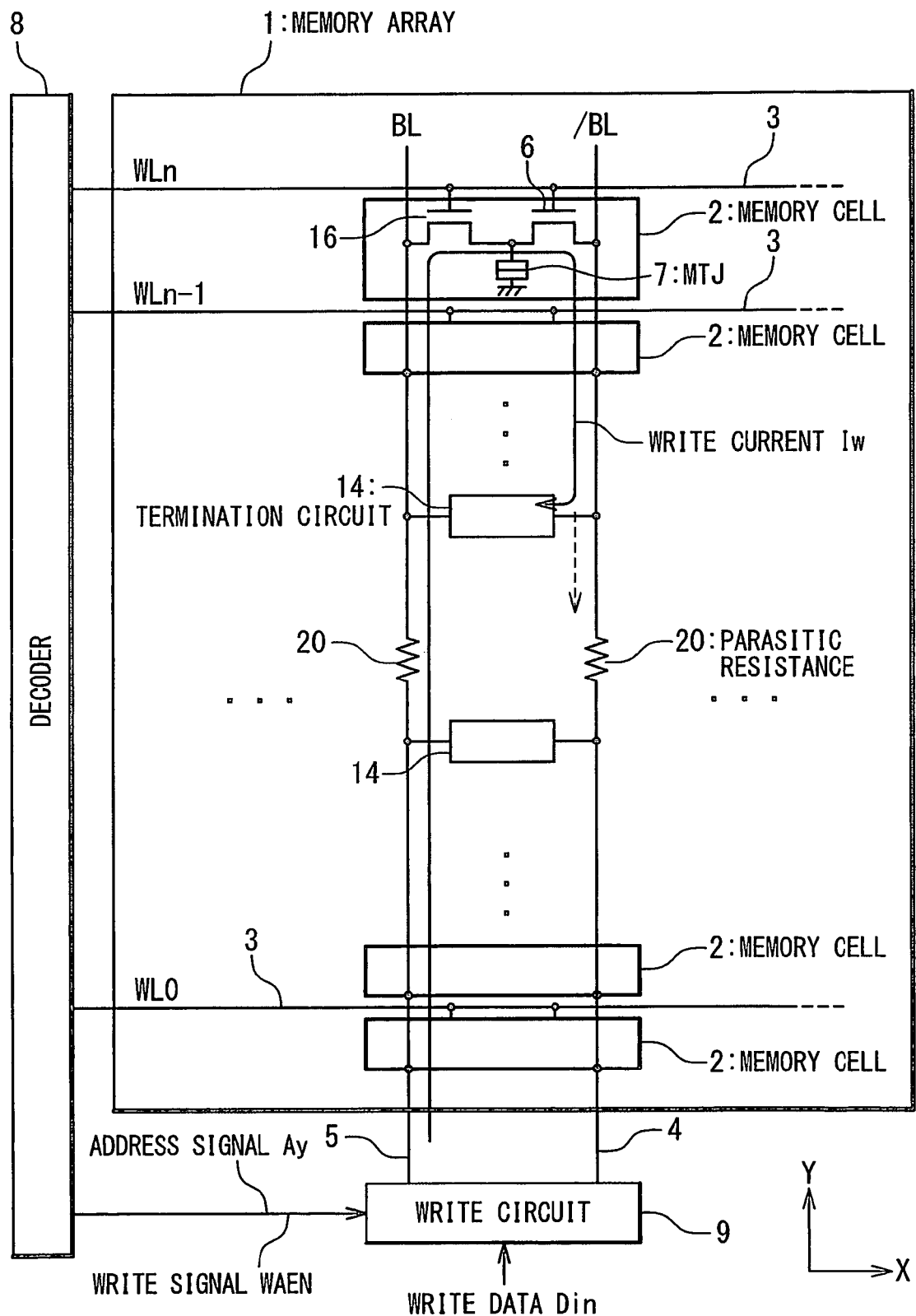
FIG. 11 is a block diagram showing a configuration of the MRAM according to a third exemplary embodiment of the present invention.

The third exemplary embodiment in the MRAM of the present invention will be described below with reference to the attached drawings. FIG. 11 is a block diagram showing a configuration of the MRAM according to the third exemplary embodiment of the present invention. The MRAM includes the memory array 1, the decoder 8 and the plurality of writing circuits 9.

The MRAM in this exemplary embodiment differs from the first exemplary embodiment in that in the memory array 1, the third bit line 10 does not exist and the terminal on one side of the MTJ element 7 is grounded, and the first bit line (/BL) 4 and the second bit line (BL) 5 are shared in the writing and the reading operations.

At the time of the reading operation, the reading current IR is supplied to the second bit line 5 electrically connected to a sense amplifier (not shown). Thus, at that time, the writing circuit 9 and the termination circuit 14 are required to be electrically disconnected from the second bit line 5 and the first bit line 4. Hence, the circuit shown in FIG. 5 is used in the writing circuit 9. Since the other configurations are similar to those in the first exemplary embodiment, their explanations are omitted.

The write current route is similar to that in the first exemplary embodiment.

Figure 12:
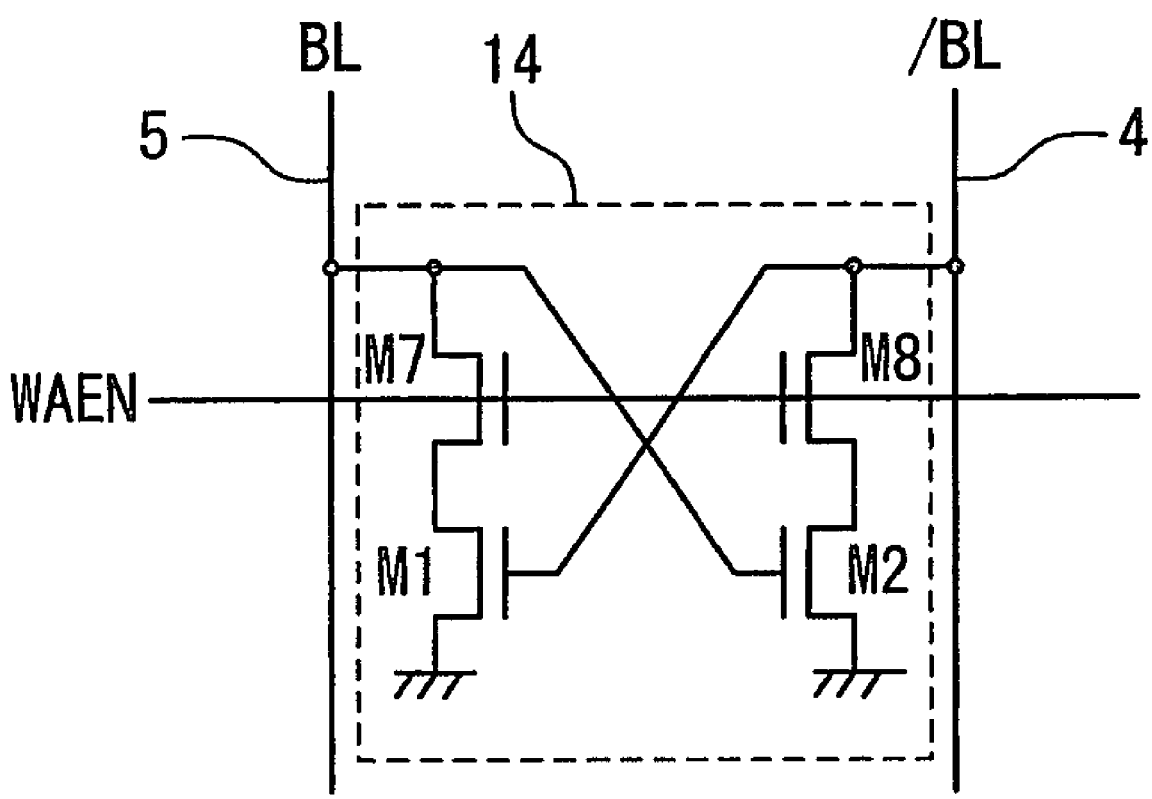
FIG. 12 is a circuit diagram showing another example of the termination circuit 14 in the MRAM in FIG. 11.

FIG. 12 is a circuit diagram showing another example of a configuration of the termination circuit 14 in the MRAM in FIG. 11. This termination circuit 14 is used in the case of using the writing circuit 9 shown in FIG. 5. The termination circuit 14 includes: N-type transistors M1, M7 for grounding the second bit line 5; and N-type transistors M2, M8 for grounding the first bit line 4. The write signal WAEN is supplied by the writing circuit 9. The transistor M1 is connected to the first bit line 4 at its gate, is connected to the transistor M7 at one terminal, and is connected to the ground line at the other terminal, respectively. The transistor M7 is connected to the supply wiring of the write signal WAEN at its gate, is connected to the second bit line 5 at one terminal, and is connected to one terminal of the transistor M1 at the other terminal, respectively. The transistor M2 is connected to the second bit line 5 at its gate, is connected to the transistor M8 at one terminal, and is connected to the ground line at the other terminal, respectively. The transistor M8 is connected to the supply wiring of the write signal WAEN at its gate, is connected to the first bit line 4 at one terminal, and is connected to one terminal of the transistor M2 at the other terminal, respectively. In this way, the configuration of the termination circuit 14 is very simple, which can suppress the increase in the circuit area to a small value.

At the writing operation, the write signal WAEN is active (at the High level), and the transistors M7, M8 are on. When the write data Din is "0", since the first bit line 4 is at the High level, the transistor M1 is on. On the other hand, since the second bit line 5 is at the Low level, the transistor M2 is off. At this time, the write current $I_W$, after passing from the first bit line 4 through the selection cell 2 and entering the second bit line 5, flows through the transistors M7, M1 into the ground line.

Similarly, when the write data Din is "1", since the first bit line 4 is at the Low level, the transistor M1 is off. On the other hand, since the second bit line 5 is at the High level, the transistor M2 is on. At this time, the write current $I_W$, after passing from the second bit line 5 through the selection cell 2 and entering the first bit line 4, flows through the transistors M8, M2 into the ground line.

Incidentally, at the time of the reading operation, the write signal WAEN is inactive (at the Low level), and the transistors M7, M8 are off. Thus, all of the termination circuits 14 inside the memory array 1 are electrically disconnected from the second bit line 5 and the first bit line 4. Thus, at the time of the reading operation, there is no influence from the termination circuit 14.

The writing operation in this exemplary embodiment is similar to that in the first exemplary embodiment except that the write signal WAEN is supplied to the termination circuit 14 at the time of the writing operation. Thus, its explanation is omitted.

The reading operation in this exemplary embodiment is similar to that in the first exemplary embodiment. Thus, its explanation is omitted.

Also in the case of this exemplary embodiment, it is possible to obtain the effect similar to that in the first exemplary embodiment. Then, according to the present invention, the sufficient write current can be stably supplied to the memory cell without any increase in the areas of the memory cell and the memory array. Thus, the memory capacity can be efficiently increased.

Fourth Exemplary Embodiment

Figure 13:
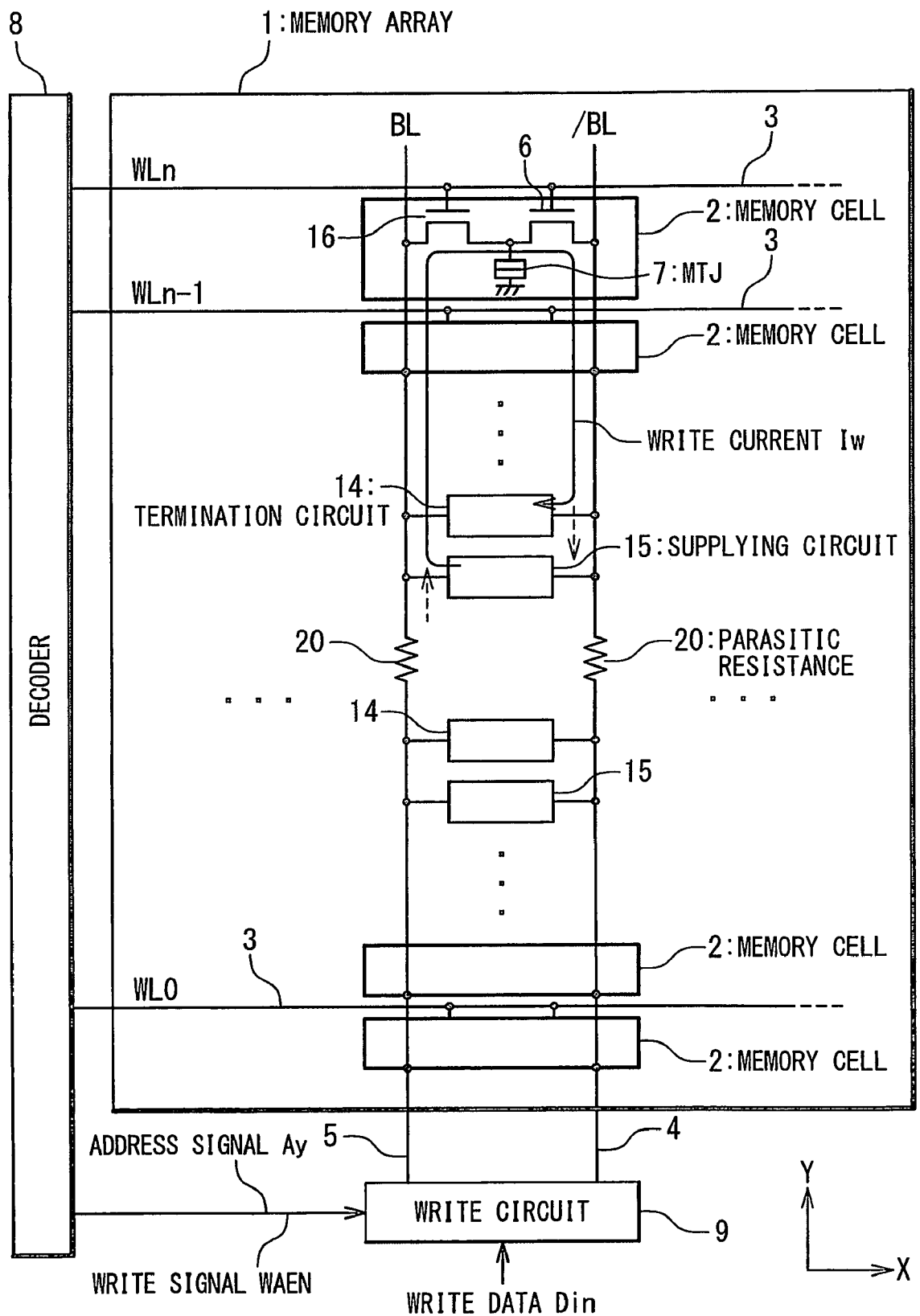
FIG. 13 is a block diagram showing a configuration of the MRAM of a fourth exemplary embodiment of the present invention.

The MRAM according to the fourth exemplary embodiment of the present invention will be described below with reference to the attached drawings. FIG. 13 is a block diagram showing a configuration of the MRAM according to the fourth exemplary embodiment of the present invention. The MRAM includes the memory array 1, the decoder 8 and the plurality of writing circuits 9.

The MRAM in this exemplary embodiment differs from the second exemplary embodiment in that in the memory array 1, the third bit line 10 does not exist, and the terminal on one side of the MTJ element 7 is grounded, and the first bit line 4 and the second bit line 5 are shared in the writing and the reading operations.

At the time of the reading operation, the reading current IR is supplied to the second bit line 5 electrically connected to the sense amplifier (not shown). Thus, the writing circuit 9 and the termination circuit 14 are required to be electrically disconnected from the second bit line 5 and the first bit line 4 at the time of the reading operation. Hence, the circuit shown in FIG. 5 is used in the writing circuit 9. Since the other configurations are similar to those in the second exemplary embodiment, their explanations are omitted.

The write current route is similar to that in the second exemplary embodiment.

Figure 14:
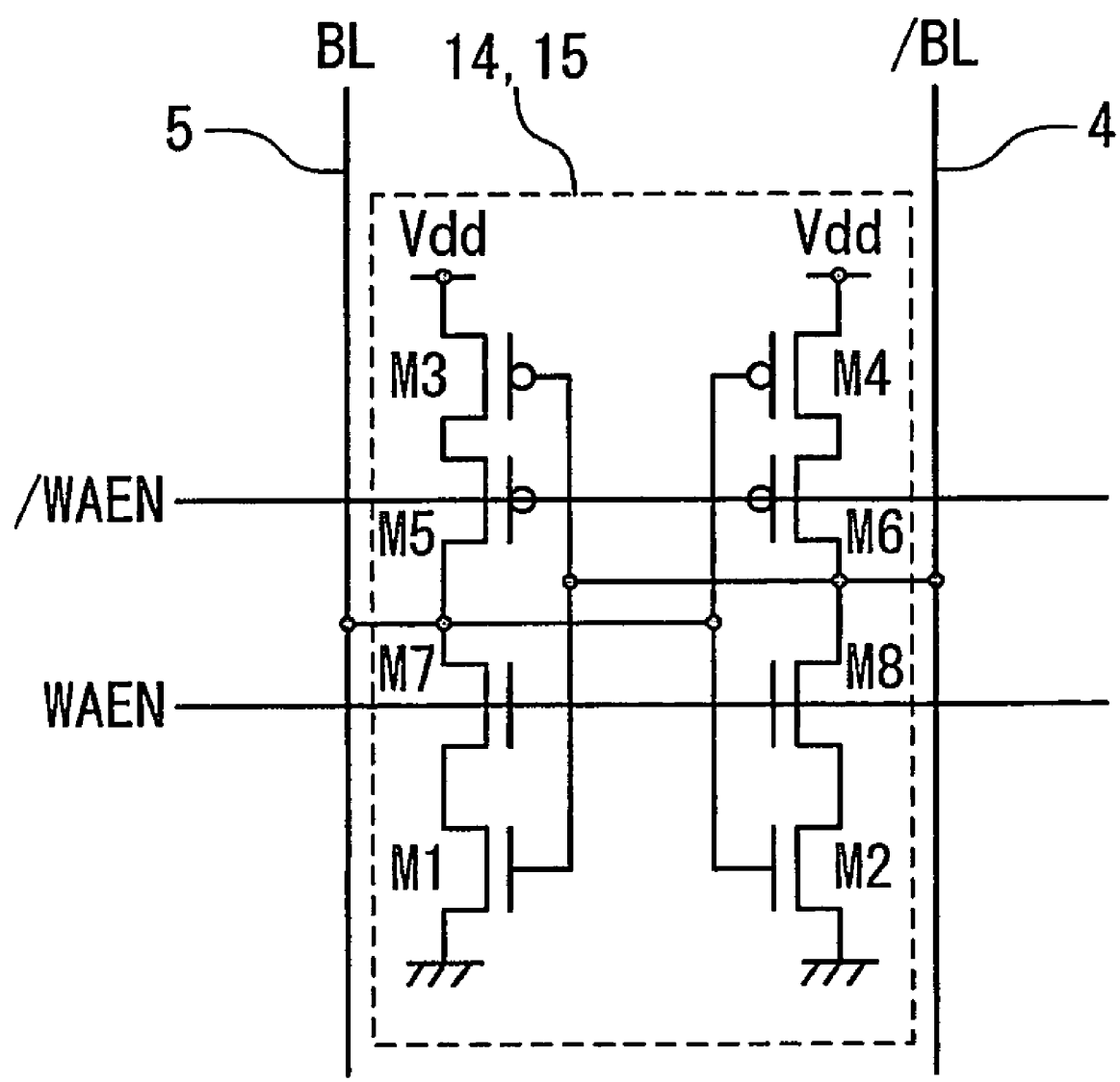
FIG. 14 is a circuit diagram showing an example of configurations of the termination circuit 14 and the supplying circuit 15 in the MRAM in FIG. 13.

FIG. 14 is a circuit diagram showing another example of configurations of the termination circuit 14 and the supplying circuit 15 in the MRAM in FIG. 13. FIG. 14 shows the termination circuit 14 and the supplying circuit 15 when the writing circuit 9 shown in FIG. 3 is used in this exemplary embodiment. In this example, the termination circuit 14 and the supplying circuit 15 are integrated. That is, the integrated termination circuit 14 and supplying circuit 15 include: the N-type transistors M1, M7 for grounding the second bit line 5; the N-type transistors M2, M8 for grounding the first bit line 4; the P-type transistors M3, M5 for supplying the write current $I_W$ to the second bit line 5; and the P-type transistors M4, M6 for supplying the write current $I_W$ to the first bit line 4.

The transistor M1 is connected to the first bit line 4 at its gate, is connected to the transistor M7 at one terminal, and is connected to the ground line at the other terminal, respectively. The transistor M7 is connected to the supply wiring of the write signal WAEN at its gate, is connected to the second bit line 5 at one terminal, and is connected to one terminal of the transistor M1 at the other terminal, respectively. The transistor M3 is connected to the first bit line 4 at its gate, is connected to the power source wiring at one terminal, and is connected to one terminal of the transistor M5 at the other terminal, respectively. The transistor M5 is connected to the supply wiring of the inversion write signal /WAEN at its gate, is connected to the other terminal of the transistor M3 at one terminal, and is connected to the second bit line 5 at the other terminal, respectively.

Also, the transistor M2 is connected to the second bit line 5 at its gate, is connected to the transistor M8 at one terminal, and is connected to the ground line at the other terminal, respectively. The transistor M8 is connected to the supply wiring of the write signal WAEN at its gate, is connected to the first bit line 4 at one terminal, and is connected to one terminal of the transistor M2 at the other terminal, respectively. The transistor M4 is connected to the second bit line 5 at its gate, is connected to the power source wiring at one terminal, and is connected to one terminal of the transistor M6 at the other terminal, respectively. The transistor M6 is connected to the inversion write signal /WAEN at its gate, is connected to the other terminal of the transistor M4 at one terminal, and is connected to the first bit line 4 at the other terminal, respectively.

That is, the integrated termination circuit 14 and supplying circuit 15 is provided with: a clocked inverter composed of the transistors M1, M3, M5 and M7 in which their inputs are the first bit line 4 and their outputs are the second bit line 5; and a clocked inverter composed of the transistors M2, M4, M6 and M8 in which their inputs are the second bit line 5 and their outputs are the first bit line 4.

In this integrated termination circuit 14 and supplying circuit 15, only when the write signal is active (the write signal WAEN is at the High level, and the inversion write signal /WAEN is at the Low level), one of the second bit line 5 and the first bit line 4 is grounded and the other becomes the power source voltage (Vdd) based on the write data Din. Then, in the integrated termination circuit 14 and supplying circuit 15, one of the circuit on the side of the first bit line 4 and the circuit on the side of the second bit line 5 is operated as the supplying circuit 15, and the other is operated as the termination circuit 14.

At the time of the reading operation, in this integrated termination circuit 14 and supplying circuit 15, all of the transistors M5, M6, M7 and M8 are off. Thus, inside the memory array 1, this integrated termination circuit 14 and supplying circuit 15 are electrically disconnected from the second bit line 5 and the first bit line 4.

The writing operation in this exemplary embodiment is similar to that in the second exemplary embodiment except that the write signal WAEN is supplied to the termination circuit 14 at the time of the writing operation. Thus, its explanation is omitted.

The reading operation in this exemplary embodiment is similar to that in the second exemplary embodiment. Thus, its explanation is omitted.

Also, in the case of this exemplary embodiment, it is possible to obtain the effect similar to that in the first exemplary embodiment. Then, according to the present invention, in the MRAM using the 2T1MTJ cell, the sufficient write current can be stably supplied to the memory cell without any increase in the areas of the memory cell and the memory array. Thus, the memory capacity can be efficiently increased.

As mentioned above, the magnetic random access memory of the present invention includes a first wiring, a second wiring, a plurality of third wirings, a plurality of memory cells and at least one terminating unit. The first wiring and the second wiring extend in a first direction. The plurality of third wirings extends in a second direction. The plurality of memory cells is arranged correspondingly to respective intersections between the first and second wirings and the plurality of third wirings. At least one terminating unit is arranged between the plurality of memory cells, and is connected to the first wiring and the second wiring. Each of the plurality of memory cells includes the two transistors and the magnetoresistive element. The two transistors are connected in series between the first wiring and the second wiring, and are controlled by a signal of the third wiring. The magnetoresistive element is connected to a wiring through which the two transistors are connected. At a time of a writing operation of each of the plurality of memory cells, when a write current is supplied from one of the first wiring and the second wiring to the other through the two transistors, the at least one terminating unit grounds the other.

The magnetic random access memory of the present invention as mentioned above may further includes at least one supplying unit. At least one supplying unit is provided between the plurality of memory cells, and is connected to the first wiring and the second wiring. At this time, at the time of the writing operation, the supplying unit supplies the write current to one of the first wiring and the second wiring.

Also, in the magnetic random access memory of the present invention, the terminating unit may include a first transistor and a second transistor. At this time, the first transistor is grounded at its source, is connected to the first wiring at its gate, and is connected to the second wiring at its drain. On the other hand, the second transistor is grounded at its source, is connected to the second wiring at its gate, and is connected to the first wiring at its drain.

Also, in the magnetic random access memory of the present invention, the terminating unit may further include a third transistor and a fourth transistor. At this time, the third transistor is provided between the second wiring and the drain of the first transistor, and electrically connects the second wiring and the drain of the first transistor at the time of the writing operation. On the other hand, the fourth transistor is provided between the first wiring and the drain of the second transistor, and electrically connects the first wiring and the drain of the second transistor at the time of the writing operation.

Also, in the magnetic random access memory of the present invention, the supplying units may include a fifth transistor and a sixth transistor. At this time, the fifth transistor is connected to the power source line at its source, is connected to the first wiring at its gate, and is connected to the second wiring at its drain. The sixth transistor is connected to the power source line at its source, is connected to the second wiring at its gate, and is connected to the first wiring at its drain.

Also, in the magnetic random access memory of the present invention, the supplying unit may further include a seventh transistor and an eighth transistor. At this time, the seventh transistor is provided between the second wiring and the drain of the fifth transistor and electrically connects the second wiring and the drain of the fifth transistor at the time of the writing operation. On the other hand, the eighth transistor is provided between the first wiring and the drain of the sixth transistor and electrically connects the first wiring and the drain of the sixth transistor at the time of the writing operation.

Also, in the magnetic random access memory of the present invention, the terminating unit may include a first transistor and a second transistor. At this time, the first transistor is grounded at its source, is connected to the first wiring at its gate, and is connected to the second wiring at its drain. On the other hand, the second transistor is grounded at its source, is connected to the second wiring at its gate, and is connected to the first wiring at its drain.

Also, in the magnetic random access memory of the present invention, the terminating unit may further include a third transistor and a fourth transistor. At this time, the third transistor is provided between the second wiring and the drain of the first transistor and electrically connects the second wiring and the drain of the first transistor at the time of the writing operation. On the other hand, the fourth transistor is provided between the first wiring and the drain of the second transistor and electrically connects the first wiring and the drain of the second transistor at the time of the writing operation.

Also, the magnetic random access memory of the present invention may further include a writing unit, which is connected to ends of the first wiring and the second wiring and sets one of the first wiring and the second wiring to a relatively high potential state and sets the other to a relatively low potential state, based on the write data, at the time of the writing operation.

As mentioned above, an operating method of a magnetic random access memory of the present invention includes following steps. Here, the magnetic random access memory includes a first wiring, a second wiring, a plurality of third wirings, a plurality of memory cells, terminating units and a writing unit. The first wiring and the second wiring extend in the first direction. The plurality of third wiring extends in the second direction. The plurality of memory cells are provided correspondingly to respective intersections between the first and second wirings and the plurality of third wirings. At least one of the terminating units is provided between the plurality of memory cells, and is connected to the first wiring and the second wiring. The writing unit is connected to the ends of the first wiring and the second wiring. Each of the plurality of memory cells includes two transistors and a magnetoresistive element. The two transistors are connected in series between the first wiring and the second wiring and controlled by a signal of the third wiring. The magnetoresistive element is connected to a wiring through which the two transistors are connected. The operating method of the magnetic random access memory includes: (A) at the time of the writing operation of each of the plurality of memory cells, the writing unit setting one of the first wiring and the second wiring to a relatively high potential state and setting the other to a relatively low potential state, based on the write data; and (B) the at least one terminating unit grounding the other, when a write current flows from one to the other through the two transistors.

Also, in the operating method of the magnetic random access memory of the present invention, the semiconductor device may further include the supplying units. At least one of the supplying units is provided between the plurality of memory cells, and is connected to the first wiring and the second wiring. At this time, the step (B) includes, (B1) the supplying unit supplying the write current to one of the first wiring and the second wiring.

According to the present invention, in the MRAM using the 2T1MTJ cell, the sufficient write current can be stably supplied to the memory cell without any increase in the areas of the memory cell and the memory array. In addition, the memory capacity can be efficiently increased.

It is apparent that the present invention is not limited to the above exemplary embodiment, but may be modified and changed without departing from the scope and spirit of the invention.

The invention claimed is:
1. A magnetic random access memory comprising:
a first wiring and a second wiring configured to extend in a first direction;
a plurality of third wirings configured to extend in a second direction;
a plurality of memory cells configured to be arranged correspondingly to respective intersections between said first wiring and said second wiring and said plurality of third wirings; and
at least one terminating unit configured to be arranged between said plurality of memory cells, and be directly connected to said first wiring and said second wiring,
wherein each of said plurality of memory cells includes:
two transistors configured to be connected in series between said first wiring and said second wiring, and be controlled by a signal of one of said plurality of third wirings, and
a magnetoresistive element configured to be connected to a wiring through which said two transistors are connected,
wherein at a time of a writing operation of each of said plurality of memory cells, when a write current is supplied from one of said first wiring and said second wiring to the other through said two transistors, said at least one terminating unit grounds the other.

2. The magnetic random access memory according to claim 1, further comprising:
at least one supplying unit configured to be provided between said plurality of memory cells, and be connected to said first wiring and said second wiring,
wherein at the time of the writing operation, said at least one supplying unit supplies said write current to one of said first wiring and said second wiring.

3. The magnetic random access memory according to claim 1, wherein said terminating unit includes:
a first transistor configured to be grounded at a source, be connected to said first wiring at a gate, and be connected to said second wiring at a drain, and
a second transistor configured to be grounded at a source, be connected to said second wiring at a gate, and be connected to said first wiring at a drain.

4. The magnetic random access memory according to claim 3, wherein said terminating unit further includes:
a third transistor configured to be provided between said second wiring and said drain of said first transistor, and electrically connect said second wiring and said drain of said first transistor at the time of the writing operation, and
a fourth transistor configured to be provided between said first wiring and said drain of said second transistor, and electrically connect said first wiring and said drain of said second transistor at the time of the writing operation.

5. The magnetic random access memory according to claim 2, wherein said at least one supplying unit includes:
a fifth transistor configured to be connected to a power source line at a source, be connected to said first wiring at a gate, and be connected to said second wiring at a drain, and
a sixth transistor configured to be connected to a power source line at a source, be connected to said second wiring at a gate, and be connected to said first wiring at a drain.

6. The magnetic random access memory according to claim 5, wherein said supplying unit further includes:
a seventh transistor configured to be provided between said second wiring and said drain of said fifth transistor and electrically connect said second wiring and said drain of said fifth transistor at the time of the writing operation, and
an eighth transistor is provided between said first wiring and said drain of said sixth transistor and electrically connect said first wiring and said drain of said sixth transistor at the time of the writing operation.

7. The magnetic random access memory according to claim 6, wherein said terminating unit includes:
a first transistor configured to be grounded at a source, be connected to said first wiring at a gate, and be connected to said second wiring at a drain, and
a second transistor configured to be grounded at a source, be connected to said second wiring at a gate, and be connected to said first wiring at a drain.

8. The magnetic random access memory according to claim 7, wherein said terminating unit further includes:
a third transistor configured to be provided between said second wiring and said drain of said first transistor and electrically connect said second wiring and said drain of said first transistor at the time of the writing operation, and
a fourth transistor configured to be provided between said first wiring and said drain of said second transistor and electrically connect said first wiring and said drain of said second transistor at the time of the writing operation.

9. The magnetic random access memory according to claim 1, further comprising:
a writing unit configured to be connected to ends of said first wiring and said second wiring, set one of said first wiring and said second wiring to a relatively high potential state and set the other to a relatively low potential state, based on said write data, at the time of the writing operation.

10. An operating method of a magnetic random access memory, wherein said magnetic random access memory includes:
a first wiring and a second wiring configured to extend in a first direction,
a plurality of third wiring configured to extend in a second direction,
a plurality of memory cells configured to be provided correspondingly to respective intersections between said first wiring and said second wiring and said plurality of third wirings,
at least one terminating unit configured to be provided between said plurality of memory cells, and be directly connected to said first wiring and said second wiring, and
a writing unit configured to be connected to ends of said first wiring and said second wiring,
wherein each of said plurality of memory cells includes:
two transistors configured to be connected in series between said first wiring and said second wiring and be controlled by a signal of one of said plurality of third wirings, and
a magnetoresistive element configured to be connected to a wiring through which said two transistors are connected,
said operating method of said magnetic random access memory comprising:
(A) at a time of a writing operation of each of said plurality of memory cells, said writing unit setting one of said first wiring and said second wiring to a relatively high potential state and setting said other to a relatively low potential state, based on a write data; and
(B) when a write current flows from one to the other through said two transistors, said at least one terminating unit grounding the other.

11. The operating method of a magnetic random access memory according to claim 10, wherein said magnetic random access memory further includes:
at least one supplying unit configured to be provided between said plurality of memory cells, and be connected to said first wiring and said second wiring,
wherein said step (B) includes,
(B1) said at least one supplying unit supplying said write current to one of said first wiring and said second wiring.

* * * * *